(12) United States Patent
Rahman et al.

(10) Patent No.: US 9,330,823 B1
(45) Date of Patent: May 3, 2016

(54) INTEGRATED CIRCUIT STRUCTURE WITH INDUCTOR IN SILICON INTERPOSER

(75) Inventors: Arifur Rahman, San Jose, CA (US); Zhaoyin D. Wu, San Jose, CA (US); Namhoon Kim, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 472 days.

(21) Appl. No.: 13/329,832

(22) Filed: Dec. 19, 2011

(51) Int. Cl.
H01F 5/00 (2006.01)
H01F 27/28 (2006.01)
H01L 27/08 (2006.01)

(52) U.S. Cl.
CPC .......................................... H01F 5/00 (2013.01)

(58) Field of Classification Search
CPC ..................................... H01F 5/00; H01F 27/28
USPC .................................... 336/200, 232; 257/531
See application file for complete search history.

(56) References Cited

U.S. PATENT DOCUMENTS

| | | | |
|---|---|---|---|
| 5,349,743 A | 9/1994 | Grader et al. |
| 5,880,925 A | 3/1999 | DuPre et al. |
| 6,031,445 A | 2/2000 | Marty et al. |
| 6,291,872 B1 | 9/2001 | Wang et al. |
| 6,342,681 B1 | 1/2002 | Goldberger et al. |
| 6,407,907 B1 | 6/2002 | Ahiko et al. |
| 6,459,561 B1 | 10/2002 | Galvagni et al. |
| 6,477,032 B2 | 11/2002 | Makl, Jr. |
| 6,477,034 B1 | 11/2002 | Chakravorty et al. |
| 6,534,249 B2 | 3/2003 | Fork et al. |
| 6,548,338 B2 | 4/2003 | Bernstein et al. |
| 6,606,237 B1 | 8/2003 | Naito et al. |
| 6,611,188 B2 | 8/2003 | Yeo et al. |
| 6,614,093 B2 | 9/2003 | Ott et al. |
| 6,664,881 B1 | 12/2003 | Thompson et al. |
| 6,759,727 B2 | 7/2004 | Ju |
| 6,791,133 B2 | 9/2004 | Farooq et al. |
| 6,794,904 B2 | 9/2004 | Ooishi et al. |
| 6,828,666 B1 | 12/2004 | Herrell et al. |
| 6,891,258 B1 | 5/2005 | Alexander et al. |
| 6,961,231 B1 | 11/2005 | Alexander et al. |
| 6,975,199 B2 | 12/2005 | Long et al. |
| 7,071,807 B1 | 7/2006 | Herbert |
| 7,109,838 B2 | 9/2006 | Brennan et al. |
| 7,250,826 B2 | 7/2007 | Gabara |
| 7,429,899 B2 | 9/2008 | Gabara |

(Continued)

FOREIGN PATENT DOCUMENTS

| | | | |
|---|---|---|---|
| CN | 101866908 A | | 10/2010 |
| JP | 2004079701 A | * | 3/2004 |
| WO | WO 2008100940 A1 | * | 8/2008 |

OTHER PUBLICATIONS

U.S. Appl. No. 13/275,883, filed Oct. 18, 2011, Chong et al.

(Continued)

*Primary Examiner* — Tsz Chan
(74) *Attorney, Agent, or Firm* — Kevin T. Cuenot; Keith Taboada

(57) ABSTRACT

An integrated circuit structure can include an interposer having a plurality of conductive layers and a die coupled to the interposer through an internal interconnect structure. The integrated circuit structure can include an inductor implemented within at least one of the conductive layers of the interposer. The inductor can include a first terminal and a second terminal. The first terminal and the second terminal can be coupled to the internal interconnect structure.

17 Claims, 5 Drawing Sheets

(56) References Cited

U.S. PATENT DOCUMENTS

| | | | |
|---|---|---|---|
| 7,446,389 B2 | 11/2008 | Cornelius | |
| 7,501,903 B2 | 3/2009 | Gabara | |
| 7,508,280 B2 | 3/2009 | Gabara | |
| 7,511,588 B2 | 3/2009 | Gabara | |
| 7,518,881 B2 | 4/2009 | Cornelius | |
| 7,701,319 B2 | 4/2010 | Kitamura et al. | |
| 7,786,836 B2 | 8/2010 | Gabara | |
| 8,068,004 B1 | 11/2011 | Chong et al. | |
| 8,138,876 B2 | 3/2012 | Ding et al. | |
| 2002/0085334 A1 | 7/2002 | Figueroa et al. | |
| 2002/0101702 A1 | 8/2002 | Makl, Jr. | |
| 2003/0001287 A1 | 1/2003 | Sathe | |
| 2003/0062602 A1 | 4/2003 | Frutschy et al. | |
| 2005/0212127 A1* | 9/2005 | Savastiouk et al. | 257/734 |
| 2006/0128059 A1* | 6/2006 | Ahn et al. | 438/108 |
| 2006/0138591 A1 | 6/2006 | Amey et al. | |
| 2006/0170527 A1 | 8/2006 | Braunisch | |
| 2006/0284718 A1 | 12/2006 | Baumgartner et al. | |
| 2007/0247268 A1* | 10/2007 | Oya et al. | 336/200 |
| 2007/0268105 A1 | 11/2007 | Walls | |
| 2008/0084265 A1 | 4/2008 | Kitamura et al. | |
| 2008/0129394 A1* | 6/2008 | Kissing et al. | 331/67 |
| 2008/0296697 A1 | 12/2008 | Hsu et al. | |
| 2008/0297299 A1 | 12/2008 | Yun et al. | |
| 2008/0309442 A1* | 12/2008 | Hebert | 336/65 |
| 2008/0315356 A1 | 12/2008 | Reisner | |
| 2009/0039916 A1 | 2/2009 | Buchmann et al. | |
| 2009/0115050 A1* | 5/2009 | Kasuya et al. | 257/701 |
| 2009/0180236 A1 | 7/2009 | Lee et al. | |
| 2010/0026368 A1* | 2/2010 | Tang et al. | 327/361 |
| 2010/0067154 A1 | 3/2010 | Deng et al. | |
| 2010/0109133 A1 | 5/2010 | Ito et al. | |
| 2010/0127937 A1 | 5/2010 | Chandrasekaran et al. | |
| 2010/0327424 A1 | 12/2010 | Braunisch et al. | |
| 2011/0084765 A1 | 4/2011 | Kim et al. | |
| 2011/0095395 A1 | 4/2011 | Ellul et al. | |
| 2011/0169171 A1 | 7/2011 | Marcoux | |
| 2011/0215472 A1 | 9/2011 | Chandrasekaran | |
| 2011/0259411 A1 | 10/2011 | Liu | |
| 2011/0291288 A1* | 12/2011 | Wu et al. | 257/774 |
| 2012/0146209 A1* | 6/2012 | Hu et al. | 257/692 |
| 2012/0147578 A1* | 6/2012 | Jin et al. | 361/774 |

OTHER PUBLICATIONS

"Allvia to Present Latest Data for Silicon Interposers and Embedded Capacitors at IMAPS 2011," Marketwire.com, Sep. 28, 2011, downloaded Jan. 17, 2012 <http://www.marketwire.com/printer_friendly?id=1566307>.

"Xilinx Uses TSV+MLM interposers for 28nm FPGA—BetaBlog," Betasights.com, Nov. 8, 2010, downloaded Jan. 17, 2012. <betasights.net/wordpress/?p=1189>.

Carlson, J. et al., "A Stackable Silicon Interposer with Integrated Through-Wafer Inductors," *Proc. of the 57th Electronic Components and Technology Conference*, May 29, 2007, pp. 1235-1238, IEEE, Piscataway, New Jersey, USA.

Lee, Heeseok et al., "Power Delivery Network Design for 3D SIP Integrated over Silicon Interposer Platform," *Proc. of the 57th Electronic Components and Technology Conference*, May 29, 2007, pp. 1193-1198, IEEE, Piscataway, New Jersey, USA.

Yoon, Jun-Bo et al., "Surface Micromachined Solenoid On-Si and On-Glass Inductors for RF Applications," *IEEE Electron Device Letters*, Sep. 1999, pp. 487-489, vol. 20, No. 9, IEEE, Piscataway, New Jersey, USA.

Yue, C. Patrick, "On-Chip Spiral Inductors with Patterned Ground Shields for Si-Based RF IC's," *IEEE Journal of Solid-State Circuits*, May 1998, pp. 743-752, vol. 33, No. 5, IEEE, Piscataway, New Jersey, USA.

Mori, Toshiaki et al., "Development of a New Interposer Including Embedded Thin Film Passive Elements," *IEEE Transactions on Advanced Packaging*, May 2009, pp. 503-508, vol. 32, No. 2, IEEE, Piscataway, New Jersey, USA.

U.S. Appl. No. 13/416,640, filed Mar. 9, 2012, Abugharbieh et al.

U.S. Appl. No. 13/075,059, filed Mar. 29, 2011, Jenkins et al.

U.S. Appl. No. 13/187,234, filed Jul. 20, 2011, Kireev et al.

Braunisch, Henning et al., "High-Speed Performance of Silicon Bridge Die-to-Die Interconnects," *IEEE International Conference on Electrical Performance of Electronic Packages and Systems (EPEPS-2011)* Oct. 23, 2011, pp. 95-98, EPEPS Administration, Urbana, Illinois, USA, http://epeps.ece.illinois.edu/.

Galal, Sherif et al., "Broadband ESD Protection Circuits in CMOS Technology" *IEEE Journal of Solid-State Circuits*, Dec. 2003, pp. 2334-2340, vol. 38, No. 12, IEEE, Piscataway, New Jersey, USA.

Kossel, Marcel et al., "A T-Coil-Enhanced 8.5 Gb/s High-Swing SST Transmitter in 65 nm Bulk CMOS With ← 16 dB Return Loss Over 10 GHz Bandwidth", *IEEE Journal of Solid-State Circuits*, Dec. 2008, pp. 2905-2920, vol. 43, No. 12, IEEE, Piscataway, New Jersey, USA.

Pillai, Edward et al., "Novel T-Coil Structure and Implementation in a 6.4-Gb/s CMOS Receiver to Meet Return Loss Specifications", *Proc. of the 57th Electronic Components and Technology Conference*, May 29, 2007, pp. 147-153, IEEE, Piscataway, New Jersey, USA.

Telli, Ali, "Practical performance of planar spiral inductors," *Proceedings of the 2004 11th IEEE International Conference on Electronics, Circuits and Systems*, Dec. 13, 2004, pp. 487-490, IEEE, Piscataway, New Jersey, USA.

Vishay Intertechnology, *An Introduction to Substrate PIMIC (Passive Integrated Microelectronic Interconnect Circuitry) Technology*, Tech Note 61082, Mar. 27, 2007, pp. 1-13, Vishay Intertechnology, Malvern, Pennsylvania, USA.

Selmi, L. et al., "Small-Signal MMIC Amplifiers with Bridged T-Coil Matching Networks," *IEEE Journal of Solid-State Circuits*, Jul. 1, 1992, pp. 1093-1096, vol. 27, No. 7, IEEE, Piscataway, New Jersey, USA.

* cited by examiner

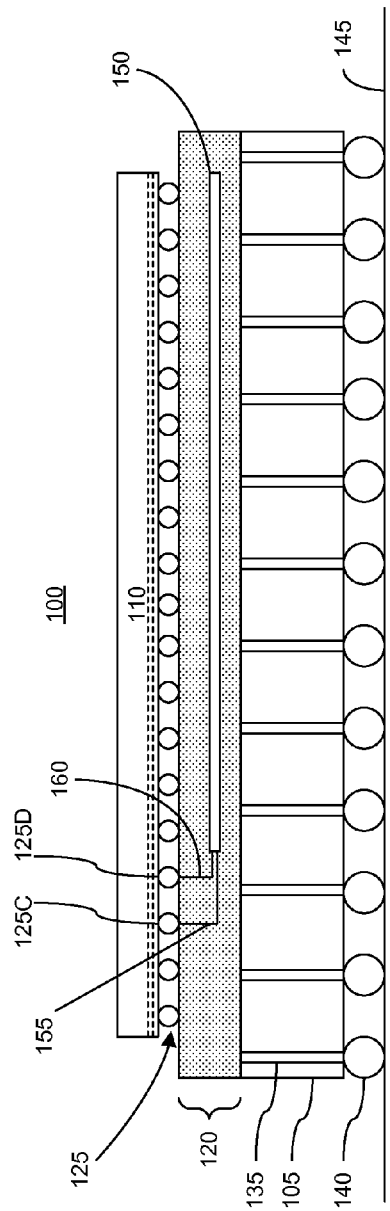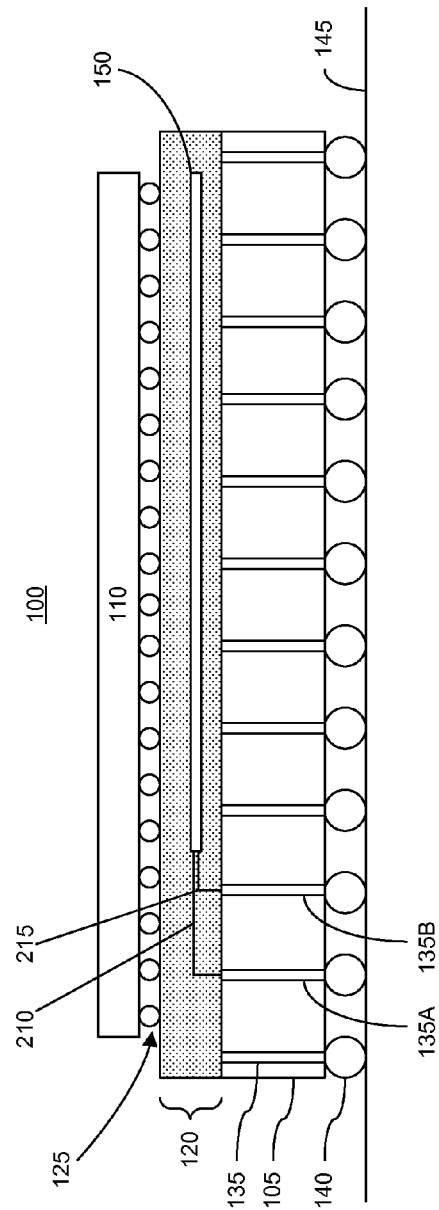

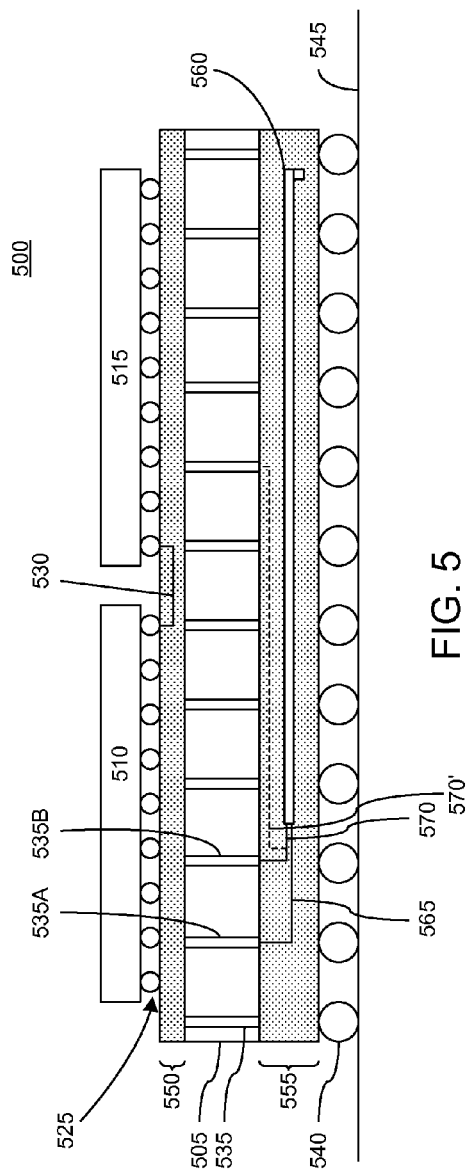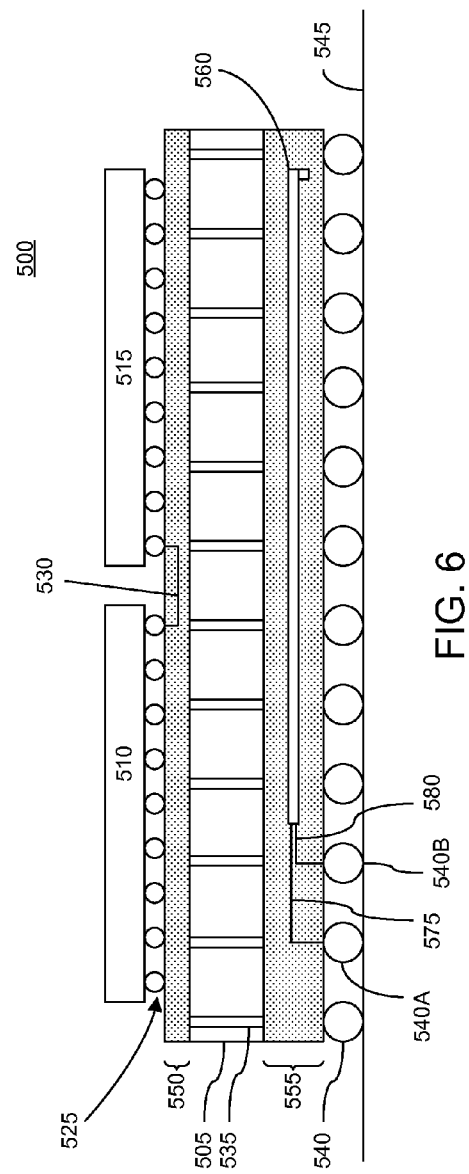

INTEGRATED CIRCUIT STRUCTURE WITH INDUCTOR IN SILICON INTERPOSER

FIELD OF THE INVENTION

One or more embodiments disclosed within this specification relate to integrated circuits (ICs). More particularly, one or more embodiments relate to implementing an inductor in an interposer of a multi-die IC structure.

BACKGROUND

Multi-die integrated circuits (ICs) are a class of ICs in which multiple dies are placed within a single package. A multi-die IC also can be referred to as a "system in a package" or "SiP." A multi-die IC can include circuit structures that allow the dies to communicate with one another within the single package at faster speeds than would be attainable were the dies to be implemented as separate ICs or as individual IC packages mounted on a printed circuit board.

For example, many modern ICs, including multi-die ICs, are capable of operating in the radio frequency (RF) range. Operating in the RF range can make implementing passive circuit elements such as inductors and capacitors within the IC structure desirable. The formation of high quality passive circuit elements within ICs, however, has been problematic.

SUMMARY

One or more embodiments disclosed within this specification relate to integrated circuits (ICs) and, more particularly, to implementing an inductor in an interposer of a multi-die IC structure.

An embodiment can include an IC structure. The IC structure can include an interposer having a plurality of conductive layers and a first die coupled to the interposer through an internal interconnect structure. An inductor can be implemented within at least one of the conductive layers of the interposer. The inductor can include a first terminal and a second terminal. The first terminal and the second terminal can be coupled to the internal interconnect structure.

In one aspect, the first terminal of the inductor can couple to a first node within the first die through the internal interconnect structure and the second terminal of the inductor can couple to a second node within the first die through the internal interconnect structure.

In another aspect, the IC structure can include a second die coupled to the interposer. The first terminal of the inductor can couple to a first node within the first die through the internal interconnect structure. The second terminal of the inductor can couple to a first node within the second die through the internal interconnect structure.

In one arrangement, the plurality of conductive layers can be implemented in layers of the interposer closest to the first die. In another arrangement, the plurality of conductive layers can be implemented in layers of the interposer farthest from the first die.

The interposer can be implemented to have a substrate resistivity that is higher than a substrate resistivity of the first die.

The one or more conductive layers of the interposer used to implement the inductor can have a thickness greater than a thickness of a conductive layer within the first die.

Another embodiment can include an IC structure. The IC structure can include an interposer having a plurality of conductive layers and a die coupled to a first planar surface of the interposer through an internal interconnect structure. The IC structure can include an external interconnect structure configured to couple a second planar surface of the interposer to nodes external to the integrated circuit structure. The IC structure also can include an inductor implemented within at least one of the conductive layers of the interposer, wherein the inductor has a first terminal and a second terminal. The first terminal of the inductor and the second terminal of the inductor each can be coupled to the external interconnect structure.

The external interconnect structure can include a plurality of solder bumps. The first terminal of the inductor can couple to a first node external to the IC structure through a first solder-bump. The second terminal of the inductor can couple to a second node external to the IC structure through a second solder-bump.

In one aspect, the plurality of conductive layers can be implemented in layers of the interposer closest to the die. In another aspect, the plurality of conductive layers can be implemented in layers of the interposer farthest from the die.

The interposer can have a substrate resistivity that is higher than the die.

The one or more conductive layers of the interposer used to implement the inductor can have a thickness greater than a thickness of a conductive layer within the die.

Another embodiment can include an IC structure. The IC structure can include an interposer having a plurality of conductive layers, a first die coupled to a first planar surface of the interposer through an internal interconnect structure, and an external interconnect structure configured to couple a second planar surface of the interposer to at least one external node. The IC structure can include an inductor implemented within at least one of the conductive layers of the interposer. The interposer further can have a substrate resistivity that is higher than a substrate resistivity of the first die.

One or more of the conductive layers of the interposer used to implement the inductor can have a thickness greater than a thickness of a conductive layer within the first die.

The inductor can include a first terminal and a second terminal. The first terminal can couple to a first node located in the first die through the internal interconnect structure. The second terminal can couple to a second node located in the first die through the internal interconnect structure.

The internal interconnect structure can include a plurality of micro-bumps. The first terminal can couple to the first node through a first of the plurality of micro-bumps. The second terminal can couple to the second node through a second of the plurality of micro-bumps.

In one aspect, the IC structure can include a second die coupled to the first die through the interposer. In that case, the inductor can include a first terminal and a second terminal. The first terminal can couple to a first node within the first die through the internal interconnect structure. The second terminal can couple to a first node within the second die through the internal interconnect structure.

In another aspect, the inductor can include a first terminal and a second terminal, wherein the first terminal couples to a first external node through the external interconnect structure and the second terminal couples to a second external node through the external interconnect structure.

The external interconnect structure can include solder bumps. Accordingly, the first terminal can couple to the first external node through a first of the plurality of solder bumps. The second terminal can couple to the second external node through a second of the plurality of solder bumps.

BRIEF DESCRIPTION OF THE DRAWINGS

FIG. 1 is a first block diagram illustrating a cross-sectional side view of an integrated circuit (IC) structure in accordance with an embodiment disclosed within this specification.

FIG. 2 is a second block diagram illustrating a cross-sectional side view of the IC structure of FIG. 1 in accordance with another embodiment disclosed within this specification.

FIG. 5 is a fifth block diagram illustrating a cross-sectional side view of an IC structure in accordance with another embodiment disclosed within this specification.

FIG. 6 is a sixth block diagram illustrating a cross-sectional side view of the IC structure of FIG. 5 in accordance with another embodiment disclosed within this specification.

DETAILED DESCRIPTION OF THE DRAWINGS

Figure 3:
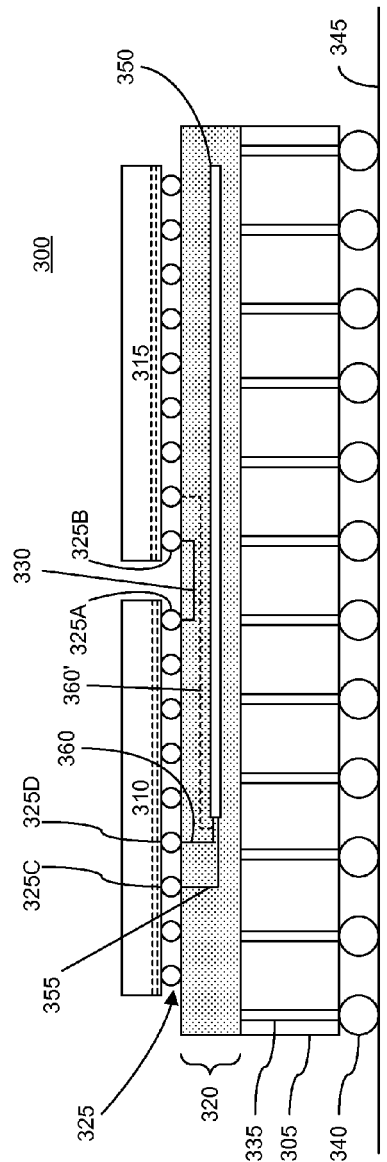
FIG. 3 is a third block diagram illustrating a cross-sectional side view of an IC structure in accordance with another embodiment disclosed within this specification.

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to implementing an inductor in an interposer of a multi-die IC structure. In accordance with one or more embodiments disclosed herein, a multi-die IC structure can include an interposer and one or more dies coupled to the interposer. The interposer can include one or more conductive layers that can be used to form one or more inductors therein. In one aspect, an inductor formed within the interposer as described can be coupled to circuitry implemented within the dies of the multi-die IC structure. In another aspect, an inductor formed within the interposer as described can be coupled to nodes external to the multi-die IC structure.

FIG. 1 is a first block diagram illustrating a cross-sectional side view of an IC structure 100 in accordance with an embodiment disclosed within this specification. As shown, IC structure 100 is an example of a multi-die structure. In general, IC structure 100 illustrates an example of a packing approach to stacking multiple dies within a single package. As shown, IC structure 100 can include an interposer 105 and a die 110.

Interposer 105 can be a die having a planar surface on which die 105 can be horizontally stacked. In one aspect, interposer 105 can be implemented with a silicon wafer substrate. In another aspect, interposer 105 can be implemented using glass, FR4 type of material, another similar type of composite material, a dielectric, or the like. As pictured, interposer 105 can provide a common mounting surface and electrical coupling point for one or more dies of a multi-die IC structure. In another aspect, interposer 105 can serve as a ground or power plane for IC structure 100.

Referring again to FIG. 1, die 110 can be located on the planar surface of interposer 105. Interposer 105 can include interconnect region 120 that includes one or more conductive layers. The conductive layers can be formed of material such as, for example, aluminum, gold, copper, nickel, various silicides, and/or the like. In one aspect, interposer 105 can be implemented as an entirely passive structure that does not include any active circuit elements. In another aspect, however, one or more additional process layers can be added to interposer 105 to create one or more active devices if so desired. In any case, interposer 105 generally is characterized by the inclusion of one or more through-silicon vias (TSVs) and inter-die wires.

Each of dies 110 and 115 can be electrically coupled to interposer 105 via an interconnect structure internal to the IC structure. Such an interconnect structure is referred to herein as an "internal interconnect structure". In general, an internal interconnect structure can electrically couple one die to another die such as an interposer. In this example, the internal interconnect structure couples die 110 to interposer 105. One example of an internal interconnect structure can be a plurality of solder bumps 125 as pictured. In one aspect, solder bumps 125 can be implemented as "micro-bumps." Each of solder bumps 125 also can serve to physically attach, e.g., couple, die 110 to interposer 105. Other examples of internal interconnect structures can include, but are not limited to, bond wires or edge wires. An adhesive material also can be used to physically attach die 110 to interposer 105. As such, the coupling of die 110 to interposer 105 via solder bumps 125, as illustrated within FIG. 1, is provided for purposes of illustration and is not intended to limit the one or more embodiments disclosed within this specification.

Interconnect region 120 can include one or more conductive layers such as, for example, patterned metal layers, through which signals can be propagated. Signals can be propagated vertically within interconnection region 120 using vias that couple adjacent ones of the conductive layers as required at selected nodes.

An external interconnect structure can be used to electrically couple interposer 105 to a surface 145. The term "external interconnect structure" refers to an interconnect structure that can be used to electrically couple an IC structure such as those described herein to external elements, e.g., to couple an interposer to the packaging of an IC. One example of an external interconnect structure can include solder bumps 140 as pictured. In one aspect, solder bumps 140 can be implemented as flip chip or controlled collapse chip connect (C4) type bumps. Surface 145 can represent a multi-die IC package, e.g., a substrate of a multi-die IC package, in which IC structure 100 is implemented. For example, solder bumps 140 can be used to physically attach interposer 105 to surface 145. As pictured, solder bumps 140 can couple IC structure 100 directly to a node external to IC structure 100 and, for example, external to the multi-die IC package.

Interconnect region 120 can be coupled to one or more TSVs 135. In general, each TSV 135 represents a via filled with conductive material that forms an electrical connection that vertically transverses, e.g., extends through a substantial portion, if not the entirety of, interposer 105. Each TSV 135 can be formed of conductive material such as, for example, copper, aluminum, gold, copper, nickel, various silicides, and/or the like. As pictured, each TSV 135 can traverse substantially through interposer 105 to couple a conductive layer, e.g., a wire, within interconnect region 120 to a solder bump 140. In this regard, each TSV 135 can form a signal path from a solder bump 140 to a solder bump 125 through interconnect region 120, thereby facilitating signal propagation into die 110.

In an embodiment, interposer 105 can be formed of material to provide interposer 105 with a substrate resistivity that is higher than the substrate resistivity of die 110. For example, interposer 105 can be implemented using a material having a substrate resistivity on the order of approximately 40, or more, ohms per centimeter. In this regard, interposer 105 can be implemented using a different process technology than is used to implement die 110. Conductive layers within interconnect region 120, for example, can be implemented with greater thickness than conductive layers implemented within die 110 pictured as dashed lines. In one example, conductive layers within interconnect region 120 can be approximately four times the thickness of a conductive layer within die 110.

An inductor 150 can be implemented within interconnect region 120 as shown. Given the higher substrate resistivity of interposer 105 than die 110, inductor 150 can demonstrate a higher quality factor, or "Q," than an inductor implemented within die 110. Further, the increased thickness of the conductive layers used to form inductor 150 leads to inductor 150 having a higher Q than an inductor implemented within die 110. In one aspect, inductor 150 can be implemented as a spiral inductor. Inductor 150, for example, can be formed of one or more turns or loops within one or more conductive layers of interconnect region 120.

In the example shown in FIG. 1, interconnect region 120 can include a number of conductive layers, e.g., "N" conductive layers where "N" is an integer value. The N conductive layers can be the top-most N layers of interposer 105. Accordingly, the conductive layers of interconnect region 120 can be considered to be the closest layers of interposer 105 to die 110.

Inductor 150 can be formed to include a first terminal and a second terminal. The first terminal (not shown) can couple to interconnect circuitry 155. Interconnect circuitry 155 can be formed of a portion of a conductive layer, e.g., a wire, coupled to one or more vias that couple to solder bump 125C. Similarly, the second terminal (not shown) can couple to interconnect circuitry 160. Interconnect circuitry 160 can be formed of a portion of a conductive layer, e.g., a wire, coupled to one or more vias that couple to solder bump 125D. Accordingly, each of the first terminal and the second terminal of inductor 150 can be coupled to a node that is located within die 110.

FIG. 2 is a second block diagram illustrating a cross-sectional side view of IC structure 100 in accordance with another embodiment disclosed within this specification. Like numbers will be used to refer to the same items throughout this specification. FIG. 2 illustrates an embodiment in which inductor 150 is coupled to nodes that are external to IC structure 100. As pictured in FIG. 2, a first terminal (not shown) of inductor 150 couples to TSV 135A via interconnect circuitry 210. A second terminal (not shown) of inductor 150 couples to TSV 135B via interconnect circuitry 215.

Accordingly, inductor 150, which is implemented within interposer 105, can be accessed, or used by, circuitry external to IC structure 100 without having to propagate signals through die 110. Rather, circuitry external to IC structure 100 can couple to inductor 150, i.e., both the first terminal and the second terminal, through solder bumps 140 and TSVs 135A and 135B as shown.

FIG. 3 is a third block diagram illustrating a cross-sectional side view of an IC structure 300 in accordance with an embodiment disclosed within this specification. As shown, IC structure 300 is an example of a multi-die structure. In general, IC structure 300 illustrates an example of a packing approach to stacking multiple dies within a single package. As shown, IC structure 300 can include an interposer 305, a die 310, and a die 315.

Interposer 305 can be a die having a planar surface on which dies 305 and 310 can be horizontally stacked. Interposer 305 can be implemented substantially as described with reference to interposer 105 of FIGS. 1 and 2. As pictured, interposer 305 can provide a common mounting surface and electrical coupling point for two or more dies of a multi-die IC structure. In one aspect, interposer 305 can serve as an intermediate layer for interconnect routing between dies. In another aspect, interposer 305 can serve as a ground or power plane for IC structure 300.

Referring again to FIG. 3, dies 310 and 315 can be located on the planar surface of interposer 305 side-by-side. Although implemented with two horizontally stacked dies within FIG. 3, IC structure 300 also can be implemented with more than two dies being horizontally stacked. In another aspect, die 315 can be stacked vertically on top of die 310. Interposer 305 also can be used as an intermediate layer between two vertically stacked dies. In that case, for example, interposer 305 can isolate vertically stacked dies from one another within a multi-die IC package.

Each of dies 310 and 315 can be electrically coupled to interposer 305 via an internal interconnect structure such as solder bumps 325. One or more conductive layers within interconnect region 320 can be used to form inter-die wires between dies 310 and 315. For example, inter-die wire 330 can be formed of one or more portions of a conductive layer, e.g., a patterned conductive layer. Vertical portions of inter-die wire 330 can be formed of one or more vias of interconnect region 320 that couple adjacent ones of conductive layers together. Inter-die wire 330, for example, can be implemented within two or more conductive layers coupled together using vias within interposer 305. The use of multiple conductive layers to implement interconnects within interposer 305 allows a greater number of signals to be routed and more complex routing of signals to be achieved within interposer 305. As shown, inter-die wire 330 couples each of solder bumps 325A and 325B together, thereby allowing the exchange of inter-die signals between dies 310 and 315.

An external interconnect structure such as solder bumps 340 can be used to electrically couple interposer 305 to a surface 345. Interconnect region 320 can be coupled to one or more TSVs 335. In this regard, each TSV 335 can form a signal path from a solder bump 340 to a solder bump 325 through interconnect region 320, thereby facilitating signal propagation into die 310 and/or die 315.

In an embodiment, interposer 305 can be formed of material to provide interposer 305 with a substrate resistivity that is higher than the substrate resistivity of die 310 and higher than the substrate resistivity of die 315. Interposer 305 also can be implemented using a different process technology than is used to implement either one of dies 310 and/or 315 allowing conductive layers within interconnect region 320, for example, to be implemented with greater thickness than conductive layers implemented within one or both of dies 310 and 315 pictured as dashed lines.

An inductor 350 can be implemented within interconnect region 320 as shown. Given the higher substrate resistivity of interposer 305 than either of dies 310 and/or 315, inductor 350 can demonstrate a higher quality factor, or "Q," than an inductor implemented within either die 310 or die 315. Further, the increased thickness of the conductive layers used to form inductor 350 leads to inductor 350 having a higher Q than an inductor implemented within either one of dies 310 and/or 315. In one aspect, inductor 350 can be implemented as a spiral inductor. Inductor 350, for example, can be formed of one or more turns or loops within one or more conductive layers of interconnect region 320.

In the example shown in FIG. 3, interconnect region 320 can include a number of conductive layers, e.g., "N" conductive layers where "N" is an integer value. The N conductive layers can be the top-most N layers of interposer 305. Accordingly, the conductive layers of interconnect region 320 can be considered to be the closest layers of interposer 305 to either one of dies 310 and 315.

Inductor 350 can be formed to include a first terminal and a second terminal. The first terminal (not shown) can couple to interconnect circuitry 355. Interconnect circuitry 355 can be formed of a portion of a conductive layer, e.g., a wire, coupled to one or more vias that couple to solder bump 325C. Similarly, the second terminal (not shown) can couple to interconnect circuitry 360. Interconnect circuitry 360 can be formed of a portion of a conductive layer, e.g., a wire, coupled to one or more vias that couple to solder bump 325D. Accordingly, each of the first terminal and the second terminal of inductor 350 can be coupled to a node that is located within die 310 or within die 315 as illustrated with alternate interconnect circuitry 360' shown in dashed line. In one aspect, the first terminal can be coupled to a node within die 310 while the second terminal is coupled to a node within die 315.

Figure 4:
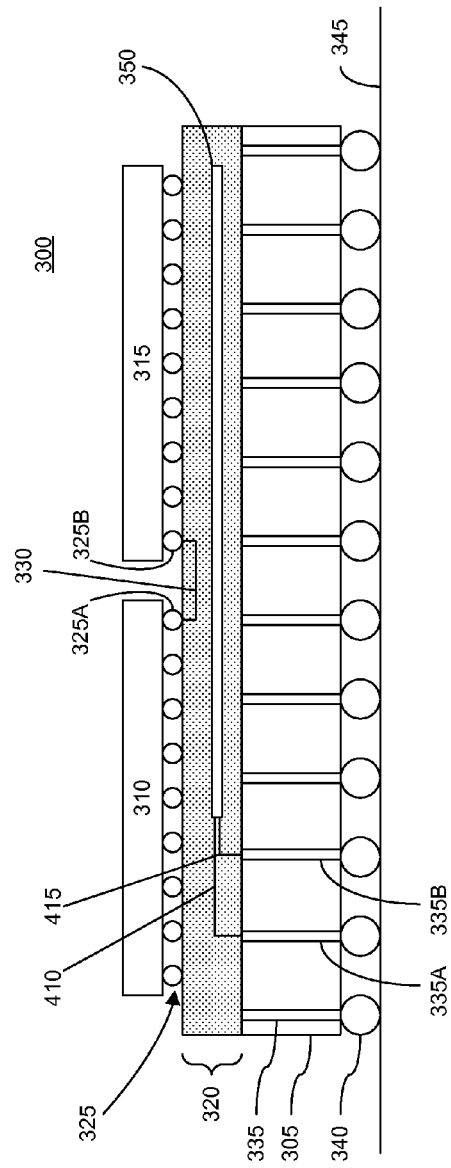
FIG. 4 is a fourth block diagram illustrating a cross-sectional side view of the IC structure of FIG. 3 in accordance with another embodiment disclosed within this specification.

FIG. 4 is a fourth block diagram illustrating a cross-sectional side view of IC structure 300 in accordance with another embodiment disclosed within this specification. FIG. 4 illustrates an embodiment in which inductor 350 is coupled to nodes that are external to IC structure 300. As pictured in FIG. 4, a first terminal (not shown) of inductor 350 couples to TSV 335A via interconnect circuitry 410. A second terminal (not shown) of inductor 350 couples to TSV 335B via interconnect circuitry 415.

Accordingly, inductor 350, which is implemented within interposer 305, can be accessed, or used by, circuitry external to IC structure 300 without having to propagate signals through either one of dies 310 and/or 315. Rather, circuitry external to IC structure 300 can couple to inductor 350, i.e., both the first terminal and the second terminal, through solder bumps 340 and TSVs 335A and 335B as shown.

FIG. 5 is a fifth block diagram illustrating a cross-sectional side view of an IC structure 500 in accordance with another embodiment disclosed within this specification. IC structure 500 can be implemented substantially similar to IC structure 300 in that IC structure 500 can include an interposer 505 upon which dies 510 and 515 are mounted. Dies 510 and 515 can be coupled to interposer 505 via an internal interconnect structure such as solder bumps 525. Interposer 505 can be coupled to a surface 545 via an external interconnect structure such as solder bumps 540. Die 510 can communicate with die 515 via interposer 505 through one or more inter-die wires 530. As shown, interposer 505 further can include one or more TSVs 535 and a first interconnect region 550.

FIG. 5 illustrates an example in which interposer 505 includes a second interconnect region 555. Interconnect region 555 can include a number of conductive layers, e.g., "M" conductive layers where "M" is an integer value. Whereas interconnect region 550 can include N layers that are the closest N layers to either of dies 510 and/or 515, interconnect region 555 can include M layers that are the M farthest layers from either of dies 510 and/or die 515.

In the example pictured in FIG. 5, each of TSVs 535 can couple to a conductive layer within interconnection region 550 and a conductive layer within interconnect region 555. As shown, an inductor 560 is implemented within interconnect region 555 using one or more of the conductive layers included therein and/or one or more vias as the case may be. Inductor 560 can include a first terminal (not shown) that is coupled to interconnect circuitry 565 and a second terminal (not shown) that is coupled to interconnect circuitry 570.

Interconnect circuitry 565 can couple to TSV 535A. Interconnect circuitry 570 can couple to TSV 535B. The configuration illustrated allows each of the first terminal and the second terminal of inductor 560 to couple to circuitry implemented within die 510, die 515, or both of dies 510 and 515. For example, each of the first terminal and the second terminal of inductor 560 can couple to nodes located within die 510 or within die 515. In another example, the first terminal can be coupled to a node within die 510 while the second terminal is coupled to a node within die 515 as illustrated with alternate interconnect circuitry 570' shown in dashed line.

Inductor 560 is located a greater distance from each of dies 510 and 515 than inductor 350 of FIGS. 3 and 4. As discussed, the substrate resistivity of dies 510 and 515 is lower than that of interposer 505. By locating inductor 560 a greater distance from each of dies 510 and 515, inductor 560 achieves an improved Q as compared to inductor 150 of FIGS. 1 and 2.

FIG. 6 is a sixth block diagram illustrating a cross-sectional side view of IC structure 500 in accordance with another embodiment disclosed within this specification. FIG. 6 illustrates an example in which inductor 560 is configured to couple to nodes that are external to IC structure 500. The first terminal (not shown) of inductor 560 couples to solder bump 540A through interconnect circuitry 575. The second terminal (not shown) of inductor 560 couples to solder bump 540B through interconnect circuitry 580.

Accordingly, inductor 560, which is implemented within interposer 505, can be accessed, or used by, circuitry external to IC structure 500 without having to propagate signals through either one of dies 510 and/or 515. Circuitry external to IC structure 100 can couple to inductor 560 through solder bumps 540 and interconnect circuitry within interconnect region 555.

Though not illustrated, it should be appreciated that an interposer configuration similar to that illustrated in FIGS. 5 and/or 6 can be implemented with a single die mounted to the surface of the interposer as illustrated with reference to FIGS. 1 and 2. Accordingly, in the case of a single die mounted on an interposer, a high quality inductor can be formed in the "M" layers of the interposer that are farthest from the die mounted thereto.

Figure 7:
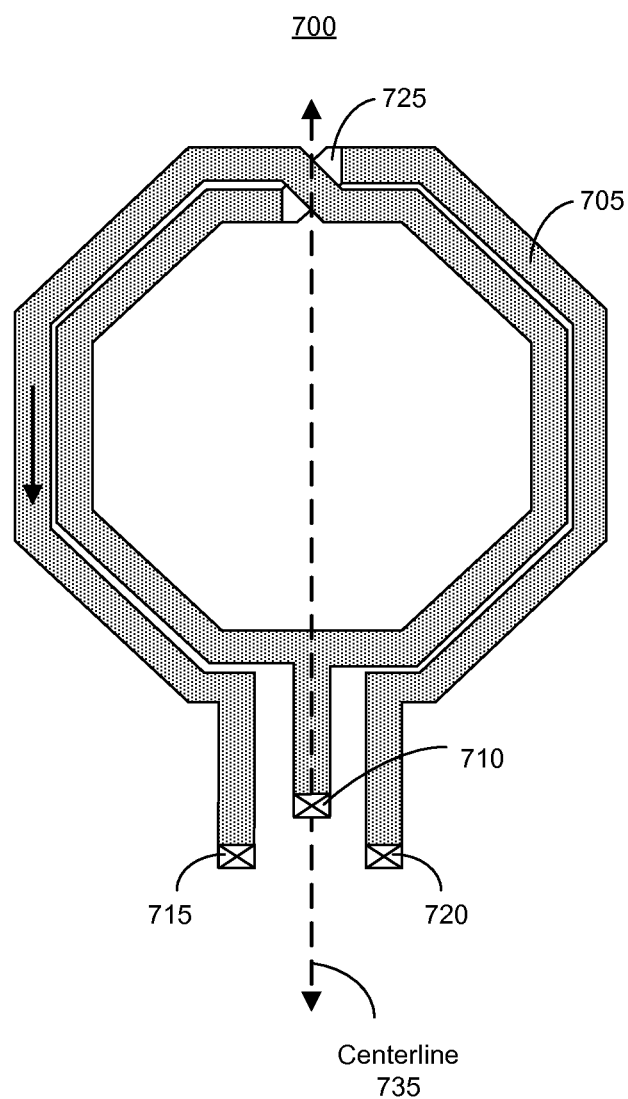
FIG. 7 is a seventh block diagram illustrating a topographical view of an inductor in accordance with another embodiment disclosed within this specification.

FIG. 7 is a seventh block diagram illustrating a topographical view of an inductor 700 in accordance with another embodiment disclosed within this specification. FIG. 7 illustrates a physical layout of inductor 700 within an IC such as an IC structure including multiple dies as described with reference to FIGS. 1-6. For example, inductor 700 is an example of an inductor that can be implemented as any of inductors 150, 350, or 560. As shown, inductor 700 is pictured as a two turn, center tap inductor.

Inductor 700 can include a coil 705, a center terminal 710, a first differential terminal 715, and a second differential terminal 720. Although denoted as four distinct objects for descriptive purposes within this specification, coil 705, center terminal 710, and terminals 715 and 720 are coupled together and can represent one continuous area of conductive material.

In addition, though implemented as one continuous area or segment of conductive material, coil 705, center terminal 710, and terminals 715 and 720 can be implemented within one or more different conductive, e.g., metal, layers of an interposer. The conductive layers can be coupled together using one or more vias to create one continuous conductive pathway. For example, coil 705 can be implemented on a first conductive layer and portion 725 can be implemented on a second and different conductive layer. Portion 725 can be coupled into coil 705 via one or more vias. Accordingly, terminals 715 and 720 can be located in a same conductive layer. In one aspect, center terminal 710 can be located in the same conductive layer as terminals 715 and 720 and, in another aspect, can be omitted. Further, as shown, each of terminals 715 and 720 can be located outside of coil 705, e.g., at respective ends of two parallel legs of inductor 700.

Coil 705 can be implemented as a symmetrical, two turn coil of inductor 700. A centerline 735 can be determined that symmetrically bisects, or substantially symmetrically bisects, coil 705. Although implemented as an octagonal coil within FIG. 7, coil 705 can be implemented in any of a variety of forms or shapes that can be implemented using available IC manufacturing processes so long as the symmetry of coil 705 about centerline 735 is retained. As such, the implementation of coil 705 as an octagonal coil within inductor 700 is provided for purposes of illustration and is not intended as a limitation of the one or more embodiments disclosed within this specification.

Figure 8:
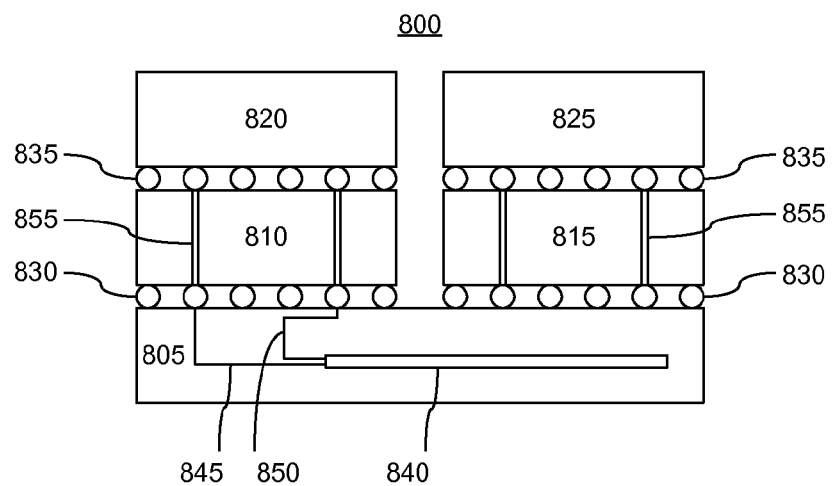
FIG. 8 is an eighth block diagram illustrating a cross-sectional side view of an IC structure in accordance with another embodiment disclosed within this specification.

FIG. 8 is an eighth block diagram illustrating a cross-sectional side view of an IC structure 800 in accordance with another embodiment disclosed within this specification. As shown, IC structure 800 is a multi-die IC structure that includes an interposer 805 having a planar surface upon which dies 810 and 815 are mounted. Dies 810 and 815 can be mounted to interposer 805 using an internal interconnect structure such as solder bumps 830. Die 820 can be mounted on die 810 via an internal interconnect structure such as solder bumps 835. Similarly, die 825 can be mounted on die 815 via solder bumps 835. In one aspect, solder bumps 830 and 835 can be implemented as micro-bump type solder bumps. The package substrate to which interposer 805 can couple via an external interconnect structure is not shown.

Interposer 805 can include an inductor 840. Inductor 840 can be implemented substantially as described within this specification within an interconnect region (not shown) within interposer 805. The interconnect region can be located in the upper-most layers of interposer 805 or in the lower-most layers of interposer 805. As shown, a first terminal of inductor 840 can be coupled to a solder bump 830 through interconnect circuitry 845. A second terminal of inductor 840 can be coupled to a solder bump 840 through interconnect circuitry 850. One or both of the first terminal and the second terminal can couple to circuitry within die 810 or can couple to circuitry within die 820 through one or more TSVs 855.

In one or more other configurations, the first terminal of inductor 840 can couple to circuitry within die 810 and the second terminal can couple to circuitry within die 820. Inductor 840 also can couple to one or both of dies 815 and 825 through interconnect circuitry similar to that described with reference to interconnect circuitry 845 and 850 and TSVs 855. For example, the first terminal of inductor 840 can couple to circuitry within die 820 and the second terminal of inductor 840 can couple to circuitry within die 825.

Figure 9:
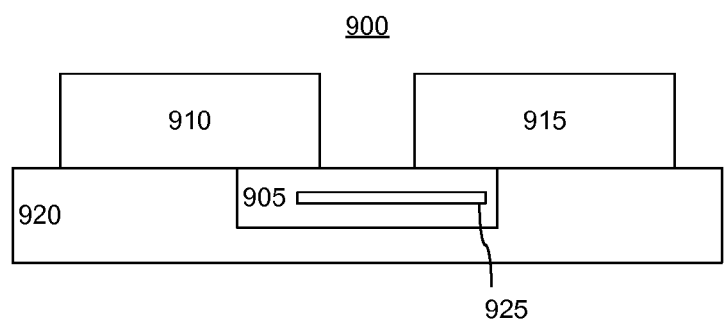
FIG. 9 is a ninth block diagram illustrating a cross-sectional side view of an IC structure in accordance with another embodiment disclosed within this specification.

FIG. 9 is a ninth block diagram illustrating a cross-sectional side view of an IC structure 900 in accordance with another embodiment disclosed within this specification. IC structure 900 can include a substrate 920 within which an interposer 905 is implemented. Substrate 920 can be implemented using an organic material. As shown, embedding interposer 905 within substrate 920 results in a planar surface upon which dies 910 and 915 can be mounted. Die 910 and die 915 can be mounted to interposer 905 and substrate 920 using any of the various methods of internal interconnect structures connections described within this specification. In one aspect, interposer 905 can be implemented without TSVs so that interposer 905 includes only inter-die wires, inductor 925, and optionally one or more active circuit elements.

Interposer 905 can include an inductor 925 implemented within an interconnect region (not shown). For ease of illustration, interconnect circuitry coupling a first terminal and a second terminal of inductor 925 to one or both of dies 910 and/or 915 are not shown. The first terminal and a second terminal of inductor 925 can couple to circuitry within die 910 or within die 915. In another configuration, the first terminal of inductor 925 can couple to circuitry within die 910 and the second terminal of inductor 925 can couple to circuitry within die 915.

Figure 10:
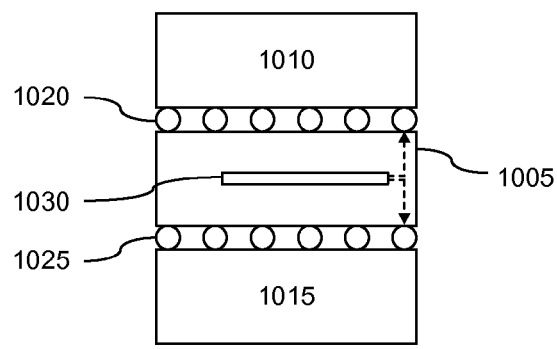
FIG. 10 is a tenth block diagram illustrating a cross-sectional side view of an IC structure in accordance with another embodiment disclosed within this specification.

FIG. 10 is a tenth block diagram illustrating a cross-sectional side view of an IC structure 1000 in accordance with another embodiment disclosed within this specification. IC structure 1000 is an example of a structure briefly noted with reference to FIG. 1 where interposer 1005 is used as an intermediate layer between die 1010 and die 1015. As shown, interposer 1005 can couple to die 1010 via an internal interconnect structure, e.g., solder bumps 1020, and to die 1015 via another internal interconnect structure, e.g., solder bumps 1025. Interposer 1005 can include an inductor 1030 that can be configured to couple to circuitry within one or both of dies 1010 and/or 1015. For example, a first terminal of inductor 1030 can be coupled to circuitry within die 1010, while a second terminal of inductor 1030 can be coupled to circuitry within die 1015. In another example, both the first and the second terminals of inductor 1030 can be coupled to circuitry within die 1010 or to circuitry within die 1015.

Inductor 1030 can be implemented within an interconnect region of interposer 1005 that is located in the uppermost layers of interposer 1005 or in the lowermost layers of interposer 1005. In one aspect, inductor 1030 can be implemented within the conductive layers that are farthest from the particular die including circuitry to which inductor 1030 is coupled. For example, inductor 1030 can be implemented in layers of interposer 1005 that are closest to die 1010 when inductor 1030 couples to circuitry within die 1015. In another example, inductor 1030 can be implemented in layers of interposer 1005 that are closest to die 1015 when inductor 1030 couples to circuitry within die 1010.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another and do not necessarily imply a sequence or chronological order.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit structure, comprising:
an interposer comprising a plurality of conductive layers, a first interconnect region that includes one or more of the plurality of conductive layers, a second interconnect region that includes one or more of the plurality of conductive layers, wherein the first interconnect region is separated from and coupled to the second interconnect region by a plurality of through silicon vias;
a first die coupled to the second interconnect region of the interposer through an internal interconnect structure; and
an inductor implemented within at least one of the conductive layers of the first interconnect region of the interposer and fully enclosed within the interposer;
wherein the inductor comprises a first terminal and a second terminal;
wherein the first terminal is coupled to the first die via the internal interconnect structure and the second terminal is coupled to the first die via the internal interconnect structure; and wherein the interposer has a substrate resistivity that is higher than a substrate resistivity of the first die.

2. The integrated circuit structure of claim 1, wherein:
the first terminal of the inductor couples to a first node within the first die through the internal interconnect structure; and
the second terminal of the inductor couples to a second node within the first die through the internal interconnect structure.

3. The integrated circuit structure of claim 1, further comprising a second die coupled to the interposer, wherein:
the first terminal of the inductor couples to a first node within the first die through the internal interconnect structure; and
the second terminal of the inductor couples to a first node within the second die through the internal interconnect structure.

4. The integrated circuit structure of claim 1, wherein the plurality of conductive layers are implemented in layers of the interposer closest to the first die.

5. The integrated circuit structure of claim 1, wherein the plurality of conductive layers are implemented in layers of the interposer farthest from the first die.

6. The integrated circuit structure of claim 1, wherein the at least one of the conductive layers of the interposer used to implement the inductor has a thickness greater than a thickness of a conductive layer within the first die.

7. The integrated circuit structure of claim 1, wherein the first die is coupled to a first planar surface of the interposer through the internal interconnect structure, the integrated circuit structure further comprising:
a second die coupled to a second planar surface of the interposer through the internal interconnect structure;
wherein the first planar surface opposes, and is parallel to, the second planar surface;
wherein the first terminal couples to a first node located in the first die through the internal interconnect structure; and
wherein the second terminal couples to a second node located in the second die through the internal interconnect structure.

8. An integrated circuit structure, comprising:
an interposer comprising a plurality of conductive layers, a first interconnect region that includes one or more of the plurality of conductive layers, a second interconnect region that includes one or more of the plurality of conductive layers, wherein the first interconnect region is separated from and coupled to the second interconnect region by a plurality of through silicon vias;
a die coupled to a first planar surface of the second interconnect region of the interposer through an internal interconnect structure;
an external interconnect structure configured to couple a second planar surface of the interposer to nodes external to the integrated circuit structure; and
an inductor implemented within at least one of the conductive layers of the first interconnect region of the interposer and fully enclosed within the interposer;
wherein the inductor comprises a first terminal and a second terminal;
wherein the first terminal of the inductor and the second terminal of the inductor each is coupled only to the external interconnect structure; and
wherein circuitry external to the integrated circuit structure couples to the inductor without propagating signals through the die.

9. The integrated circuit structure of claim 8, wherein:
the external interconnect structure comprises a plurality of solder bumps;
the first terminal of the inductor couples to a first node external to the integrated circuit structure through a first solder-bump; and
the second terminal of the inductor couples to a second node external to the integrated circuit structure through a second solder-bump.

10. The integrated circuit structure of claim 8, wherein the plurality of conductive layers are implemented in layers of the interposer closest to the die.

11. The integrated circuit structure of claim 8, wherein the plurality of conductive layers are implemented in layers of the interposer farthest from the die.

12. The integrated circuit structure of claim 8, wherein the interposer has a substrate resistivity that is higher than a substrate resistivity of the die.

13. The integrated circuit structure of claim 8, wherein the at least one of the conductive layers of the interposer used to implement the inductor has a thickness greater than a thickness of a conductive layer within the die.

14. An integrated circuit structure, comprising:
an interposer comprising a plurality of conductive layers, a first interconnect region that includes one or more of the plurality of conductive layers, a second interconnect region that includes one or more of the plurality of conductive layers, wherein the first interconnect region is separated from and coupled to the second interconnect region by a plurality of through silicon vias;
a first die coupled to a first planar surface of the second interconnect region of the interposer through an internal interconnect structure;
an external interconnect structure configured to couple a second planar surface of the interposer circuitry external to the integrated circuit; and
an inductor implemented within at least one of the conductive layers of the first interconnect region of the interposer and fully enclosed within the interposer;
wherein the interposer has a substrate resistivity that is higher than a substrate resistivity of the first die;
wherein a first terminal of the inductor and a second terminal of the inductor each is coupled only to the external interconnect structure; and
wherein the circuitry external to the integrated circuit structure couples to the inductor without propagating signals through the first die.

15. The integrated circuit structure of claim 14, wherein the at least one of the conductive layers of the interposer used to implement the inductor has a thickness greater than a thickness of a conductive layer within the first die.

16. The integrated circuit structure of claim 14, wherein:
the first terminal couples to a first external node through the external interconnect structure; and
the second terminal couples to a second external node through the external interconnect structure.

17. The integrated circuit structure of claim 16, wherein:
the external interconnect structure comprises solder bumps;
the first terminal couples to the first external node through a first of the plurality of solder bumps; and
the second terminal couples to the second external node through a second of the plurality of solder bumps.

* * * * *